(12) United States Patent
Steensgaard-Madsen et al.

(10) Patent No.: US 8,576,104 B2
(45) Date of Patent: Nov. 5, 2013

(54) SIMULTANEOUSLY-SAMPLING SINGLE-ENDED AND DIFFERENTIAL TWO-INPUT ANALOG-TO-DIGITAL CONVERTER

(75) Inventors: Jesper Steensgaard-Madsen, San Jose, CA (US); Micah Galletta O'Halloran, Andover, MA (US); Florin Oprescu, San Diego, CA (US)

(73) Assignee: Linear Technology Corporation, Milpitas, CA (US)

( * ) Notice: Subject to any disclaimer, the term of this patent is extended or adjusted under 35 U.S.C. 154(b) by 104 days.

(21) Appl. No.: 13/166,360

(22) Filed: Jun. 22, 2011

(65) Prior Publication Data
US 2012/0326909 A1 Dec. 27, 2012

(51) Int. Cl.
*H03M 1/12* (2006.01)
(52) U.S. Cl.
USPC .......................................... 341/155; 341/161
(58) Field of Classification Search
USPC ......................................... 341/155, 161, 172
See application file for complete search history.

(56) References Cited

U.S. PATENT DOCUMENTS

| | | | | |
|---|---|---|---|---|
| 5,204,679 A | * | 4/1993 | Jessner et al. | 341/159 |
| 6,229,469 B1 | * | 5/2001 | Gaudet | 341/143 |
| 7,852,252 B2 | * | 12/2010 | Ge et al. | 341/155 |
| 8,040,271 B2 | * | 10/2011 | Furuta et al. | 341/172 |
| 8,130,132 B2 | * | 3/2012 | Nakano | 341/158 |
| 8,134,623 B2 | * | 3/2012 | Purcell et al. | 348/301 |
| 2009/0096654 A1 | | 4/2009 | Zhu et al. | |

FOREIGN PATENT DOCUMENTS

WO 2009034543 A1 3/2009

OTHER PUBLICATIONS

Matsuya et al., "A 16-Bit Oversampling A-TO-D Conversion Technology Using Triple-Integration Noise Shaping", IEEE Journal of Solid-State Circuits, 22(6): 921-929 (Dec. 1, 1987).
Extended European Search Report issued in EP Application No. 12004634.7 dated Dec. 6, 2012.

* cited by examiner

*Primary Examiner* — Brian Young
(74) *Attorney, Agent, or Firm* — McDermott Will & Emery LLP

(57) ABSTRACT

An analog-to-digital converter (ADC) system configured to receive a first and a second analog quantity and to provide a plurality of numerical parameters representative of the first and second analog quantities. The ADC system includes a first, a second, and a third ADC circuit, and a digital interface circuit. The first ADC circuit is configured to provide a first code representative of the first analog quantity and to provide a first analog residue quantity representative of the first analog quantity with respect to the first code. The second ADC circuit is configured to provide a second code representative of the second analog quantity and to provide a second analog residue quantity representative of the second analog quantity with respect to the second code. The third ADC circuit is configured to receive the first and second analog residue quantities, and to provide a third digital code representative of a difference of the first and second analog residue quantities. The digital interface circuit is configured to receive the first, second, and third codes, and to provide the plurality of numerical parameters representative of the first and second analog quantities.

18 Claims, 8 Drawing Sheets

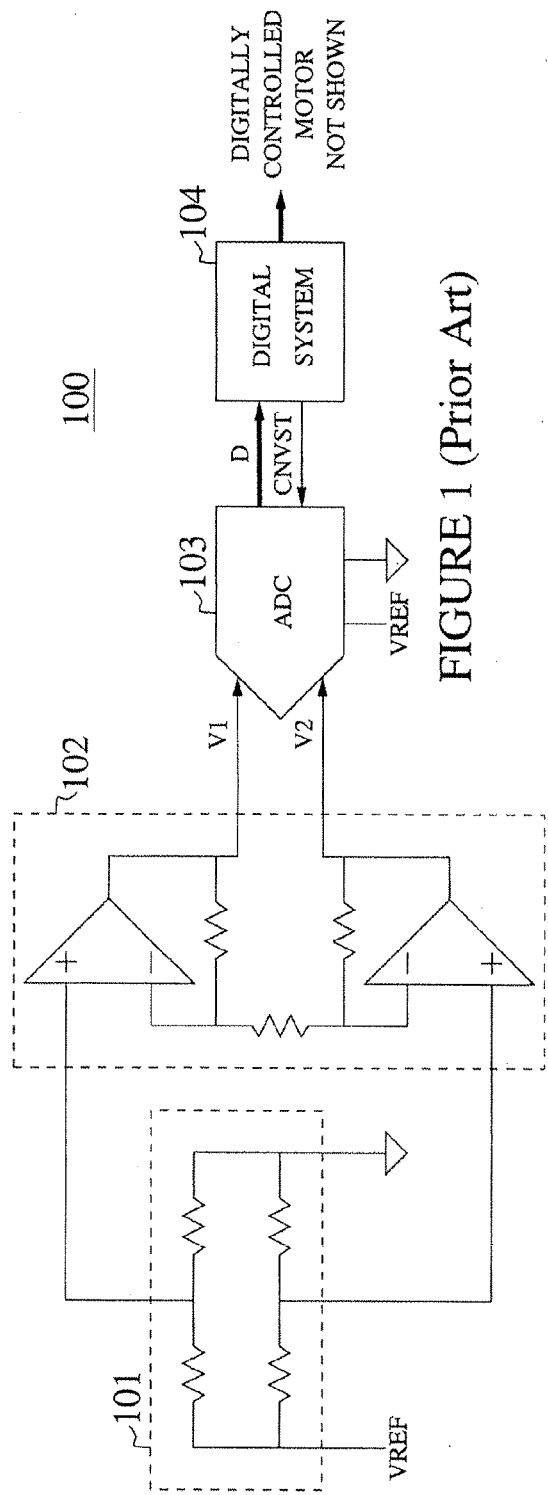
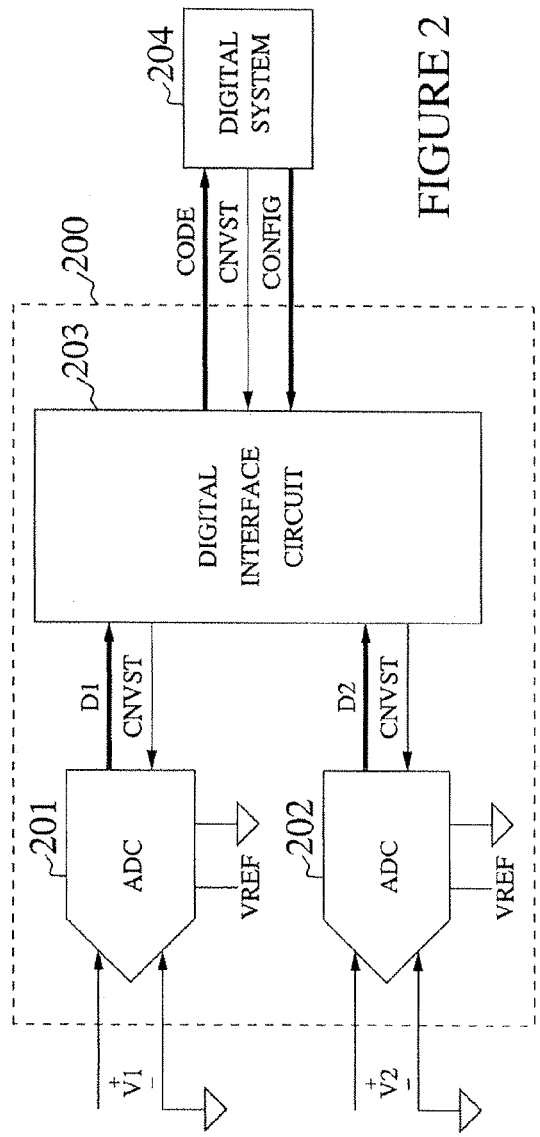

US 8,576,104 B2

SIMULTANEOUSLY-SAMPLING SINGLE-ENDED AND DIFFERENTIAL TWO-INPUT ANALOG-TO-DIGITAL CONVERTER

BACKGROUND

1. Technical Field

The present teaching relates to electrical circuits. Particularly, the present teaching relates to analog-to-digital converters.

2. Discussion of Technical Background

Analog-to-digital converters (ADCs) are used for a wide range of applications, including, but not limited to, sensor interfaces, industrial applications, consumer applications, and communications. Various circuits and techniques have been developed for analog-to-digital (A/D) conversion targeting various applications and their varying requirements in terms of speed, resolution, noise, power consumption, and other performance related parameters.

An analog-to-digital converter (ADC) may be configured to provide a numerical representation of a differential signal, such as for example a voltage difference provided by a strain-gauge sensor circuit. The voltage difference may provide information about a strain parameter (deflection, torque, etc.) for an axle of a machine, and a numerical representation of the voltage difference may be used as an input for a digital control system regulating power delivered to an electrical motor coupled to the axle. If the numerical representation is a false indication of the actual strain parameter, the digital control system may cause the electrical motor to damage the axle and/or structures connected to the axle. It is desirable that a digital control system be able to detect that it may be receiving false indications, so that measures can be taken to prevent damage and injuries.

FIG. 1 shows a prior-art configuration of a digital control system 100 observing a signal from a strain-gauge sensor 101. The strain-gauge sensor 101 provides a voltage difference that is amplified by an instrumentation-amplifier circuit 102. Instrumentation-amplifier circuit 102 amplifies the voltage difference by a predetermined amplification factor so that a full-scale stimuli of the strain-gauge sensor 101 corresponds to a full-scale range of a digital representation provided by ADC circuit 103 to a digital system 104. An overall gain factor is nominally independent of a reference voltage VREF provided to strain-gauge sensor 101 and to ADC circuit 103. A nominal operation of ADC circuit 103 may be characterized by $D=(V1-V2)/VREF$, where D is a numerical value designated by a digital code with N bits. V1 is a voltage (relative to a reference node/terminal, which may be referred to as ground) applied to a first input terminal of ADC circuit 103. V2 is a voltage applied to a second input terminal of ADC circuit 103. ADC circuit 103 may provide 16-bit codes to digital system 104 to designate numerical values in a numerical full-scale range having a lower limit (−32768/32768) and an upper limit 32767/32768. The lower limit may nominally correspond to a stimuli of strain-gauge sensor 101 for which V1~0V and V2~VREF. The upper limit may nominally correspond to a stimuli of strain-gauge sensor 101 for which V1~VREF and V2~0V. Strain-gauge sensor 101 and instrumentation-amplifier circuit 102 may be designed such that, during normal operation, a change of voltage V1 will correspond to an equal-but-opposite change of voltage V2. For example, normal operation may be characterized by a nominal constraint V1+V2~VREF. Any substantial deviation from the nominal constraint indicates that D may be a false representation of the stimuli of strain-gauge sensor 101. Prior-art ADC circuit 103 provides only one numerical parameter D to characterize the two analog input voltages (V1,V2), and digital system 104 is not able to detect that $D=(V1-V2)/VREF=0$ may be a false reading when, for example, $V1=V2=VREF/4$.

What is needed is an analog-to-digital converter circuit and method to provide a plurality of parameters for a two-input analog signal so that relatively more robust, flexible and fault-tolerant systems involving analog-to-digital conversion can be implemented.

SUMMARY

An embodiment of an analog-to-digital converter system is described wherein a first analog-to-digital converter circuit is configured to provide a first code representative of a first analog quantity, and to provide a first analog residue quantity representative of the first analog quantity with respect to the first code. A second analog-to-digital converter circuit is configured to provide a second code representative of a second analog quantity, and to provide a second analog residue quantity representative of the second analog quantity with respect to the second code. A third analog-to-digital converter circuit is configured to provide a third code representative of a difference of the first analog residue quantity and the second analog residue quantity. A digital interface circuit is configured to provide an output code representative of at least one of the first, second, and third codes.

A method is described for providing a plurality of numerical parameters representative of a first analog quantity and a second analog quantity. The method includes a step of generating a first code representative of the first analog quantity, and generating a second code representative of the second analog quantity. The method further includes a step of combining the first and second codes and first and second analog quantities to derive an analog residue quantity, and generating a third code representative of the analog residue quantity. The method further includes a step of combining the first, second, and third codes to provide the plurality of numerical parameters.

Other embodiments involving methods and circuits for providing a plurality of parameters for two analog input quantities according to the present teaching are described.

BRIEF DESCRIPTION OF THE DRAWINGS

The present teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1 (Prior Art) illustrates a digital control system.

FIG. 2 illustrates a functional representation of several embodiments of the present teaching.

DETAILED DESCRIPTION

Figure 3:
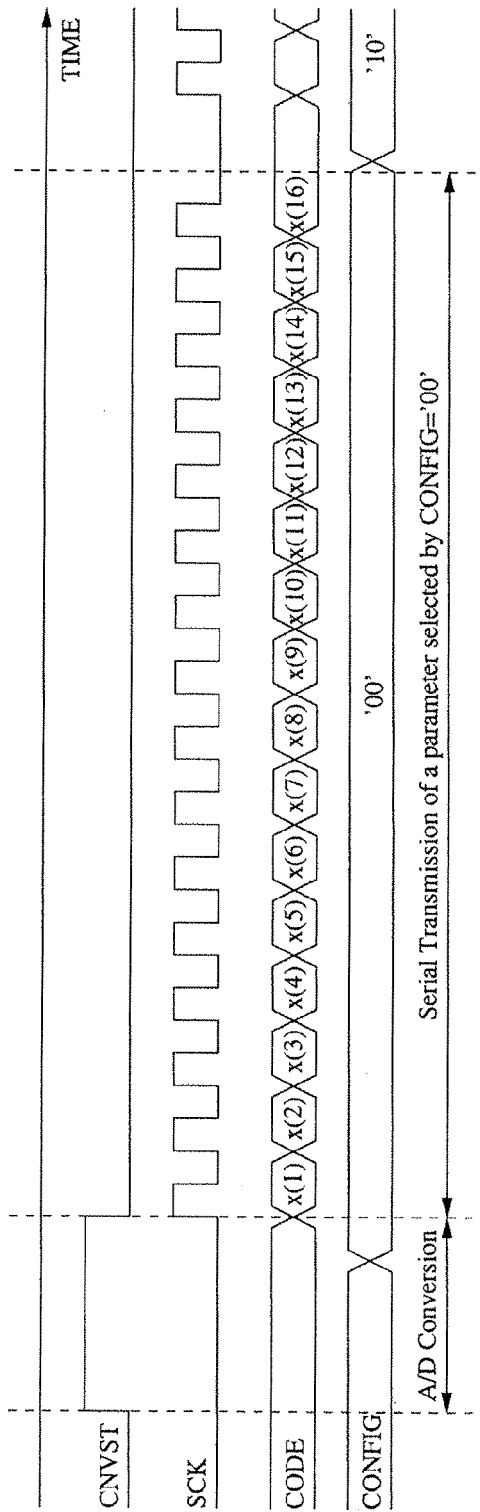
FIG. 3 illustrates a timing diagram for a first embodiment of the present teaching.

The present teaching discloses analog-to-digital conversion methods and circuits for providing a plurality of numerical parameters for two analog input quantities so that relatively more robust, flexible and fault-tolerant systems involving analog-to-digital conversion can be implemented.

FIG. 2 shows a functional representation of several embodiments according to the present teaching. An A/D converter system 200 receives two analog quantities, a first voltage V1 and a second voltage V2, and provides a digital code CODE to a digital system 204. Voltages V1 and V2 may be provided by a sensor-interface circuit similar to that described with reference to FIG. 1 (not shown in FIG. 2). Digital system 204 may be similar to digital system 104 of FIG. 1. Accordingly, A/D converter system 200 may be incorporated in a digital control system monitoring a strain parameter for an axle, or in some other type of application. Digital code CODE provides information about voltages V1 and V2 with respect to a reference terminal (ground) and a reference voltage VREF. Digital code CODE may provide a plurality of numerical parameters, including a first code segment representative of a difference between V1 and V2, such as for example D=(V1−V2)/VREF. Digital code CODE may also comprise a second code segment representative of the first input voltage V1, such as for example D1=V1/VREF. Another code segment may be representative of V2, for example D2=V2/VREF. Specifically, in an embodiment of the present teaching, a first weighted representation of V1 and V2 is provided by a first segment of digital code CODE nominally designating a numerical value DA=(a1*V1+a2*V2)/VREF. A second weighted representation of V1 and V2 is provided by a second segment of digital code CODE nominally designating a numerical value DB=(b1*V1+b2*V2)/VREF. When scalar coefficients (a1,a2) and (b1,b2) are different from one another (i.e., when first and second weighted representations are different) digital system 204 may combine numerical values DA and DB to obtain a numerical value representative of another weighted representation DC=(c1*V1+c2*V2)/VREF. A weighted representation for which scalar coefficients a1 and a2 are nominally the same may be considered to be representative of an average of V1 and V2. ADC system 200 may be configurable, and digital system 204 may select a first set of information to be represented by CODE in a first configuration of ADC system 200, and a second set of information to be represented by CODE in a second configuration of ADC system 200. Accordingly, digital system 204 may provide configuration information CONFIG to instruct ADC system 200 to provide CODE in a predefined format to provide a plurality of parameters for V1 and V2. For example, ADC system 200 may be configured to provide 16-bit digital codes CODE, and CONFIG may be a 2-bit code selecting CODE to be a 16-bit numerical representation of (V1−V2)/VREF for CONFIG='00', (V1+V2)/VREF for CONFIG='01', V1/VREF for CONFIG='10' and V2/VREF for CONFIG='11'. Digital system 204 may apply CONFIG='00' for a first mode of operation (e.g., a digital control system), and digital system 204 apply another value of CONFIG to determine whether a constraint for V1,V2 is fulfilled or whether a fault condition may have occurred.

FIG. 3 shows a timing diagram for a first embodiment of the present teaching. An operation will be described with reference to FIGS. 2 and 3. An A/D conversion cycle is initiated by a rising edge of a conversion-start signal CNVST. ADC system 200 is configured to provide a digital code CODE in a serial format via a serial interface during a transmission period after the conversion cycle. Digital code CODE comprises code segments of each 16 bits x(n) that are read at falling edges of a timing signal SCK provided by digital system 204 (not shown explicitly in FIG. 2). Accordingly, a serial interface circuit may be configured to transmit CODE at a plurality of time instances when a timing signal transitions from a first state to a second state. A 16-bit code segment represents a parameter selected by a 2-bit configuration code CONFIG provided by digital system 204. A first selection, for example CONFIG='00', may be made to obtain a first parameter when providing 16 clock pulses of timing signal SCK after the conversion cycle. A second selection may be made, for example CONFIG='10', to obtain a second parameter by applying CONFIG='10' and providing another 16 clock pulses of timing signal SCK (after reading the first parameter). Any number of 16-bit code segments (each corresponding to a value of CONFIG) may be read to obtain one or more parameters for a given A/D conversion cycle and result. Another embodiment of the present teaching may be configured to communicate segments of digital code CODE via a 16-bit parallel interface, in which case a timing signal SCK for a serial interface may not be needed. Another embodiment may be configured to communicate code segments via a serial interface having a plurality of data lanes, for example to simultaneously communicate several code segments. Various embodiments of the present teaching may incorporate a serial interface circuit having a chip-select feature to mask pulses of a timing signal SCK and/or to configure the serial interface to enter a high-impedance state.

Figure 4:
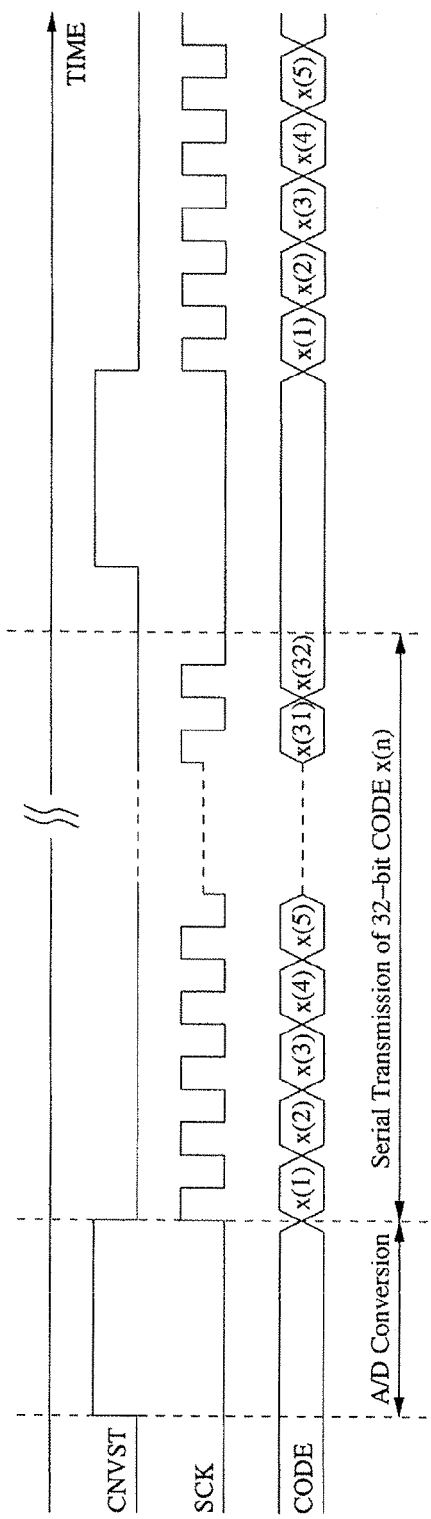
FIG. 4 illustrates a timing diagram for a second embodiment of the present teaching.

FIG. 4 shows a timing diagram for a second embodiment of the present teaching. An operation will be described with reference to FIGS. 2 and 4. It is an objective to minimize a number of pins of a package encapsulating A/D system 200, and the second embodiment does not allocate any pin to receive a configuration code CONFIG. A digital interface circuit 203 is configured to provide composite codes CODE in a predefined format comprising a first code segment and a second code segment. Each composite code CODE comprises 32 bits x(n), wherein the first 16 bits (x(1), x(2), . . . , x(16)) are a first code segment representative of a first parameter, and wherein the last 16 bits (x(17), x(18), . . . x(32)) are a second code segment representative of a second parameter. Digital system 204 may be configured to read any number of bits of a CODE (by providing a corresponding number of pulses for timing signal SCK) from a conversion cycle. For example, digital system 204 may apply 16 SCK pulses for each of 63 consecutive A/D conversion cycles, and 32 SCK pulses for a 64th A/D conversion cycle. Accordingly, digital system 204 may obtain the first parameter representative of V1 and V2 for all 64 conversion cycles, and obtain the second parameter representative of V1 and V2 for only the 64th conversion cycle (e.g., to occasionally check that a constraint for V1,V2 is fulfilled).

Figure 5:
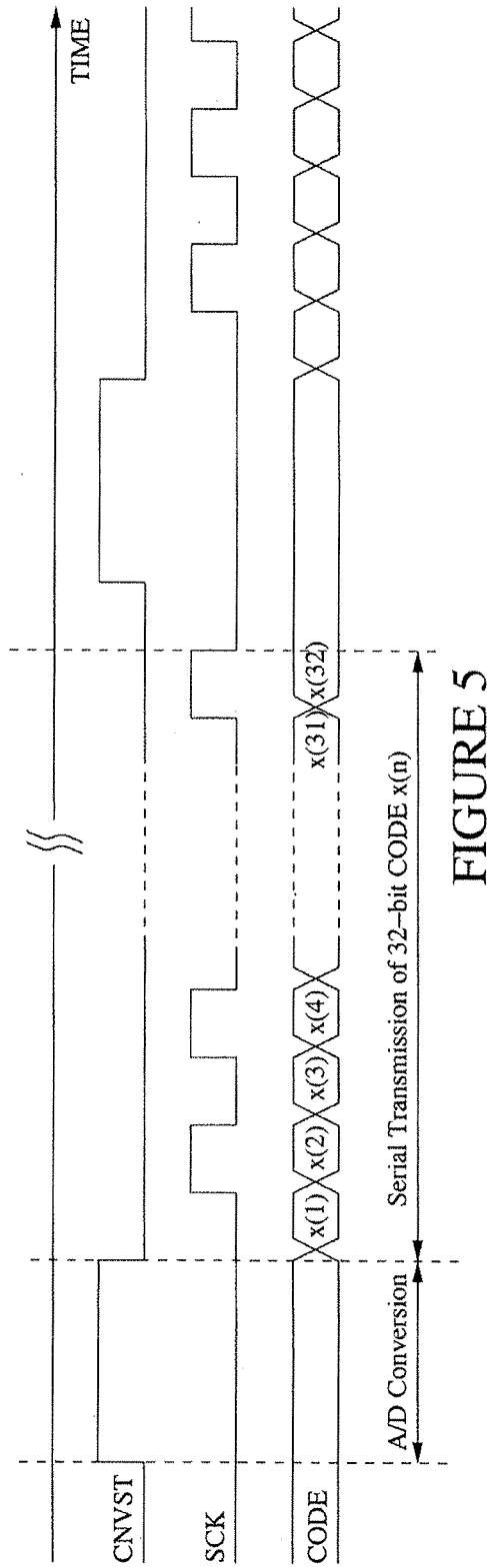
FIG. 5 illustrates a timing diagram for a third embodiment of the present teaching.

FIG. 5 shows a timing diagram for a third embodiment of the present teaching. Similar to the second embodiment (described above), digital interface circuit 203 provides 32-bit composite codes composed of a first code segment and a second code segment. Digital system 204 reads the first code segment, representative of a first parameter, by evaluating a serial interface at rising edges of a timing signal SCK. Likewise, digital system 204 reads the second code segment, representative of a second parameter, by evaluating the serial interface at falling edges of the timing signal SCK. Accordingly, a serial interface circuit may be configured to transmit the first code segment at a first plurality of time instances when a timing signal transitions from a first state to a second state; the serial interface circuit may further be configured to transmit the second code segment at a second plurality of time instances when the timing signal transitions from the second state to the first state. The first code segment is represented by 16 bits of the 32-bit composite codes having odd indices (x(1), x(3), . . . , x(31)), and the second code segment is represented by other 16 bits of the 32-bit composite codes having even indices (x(2), x(4), . . . , x(32)). Digital system 204 may be configured to read either the first or the second code segment (parameter) by selecting to evaluate the serial interface at either rising or falling edges of timing signal SCK. Digital system 204 may also be configured to evaluate the serial interface at both rising and falling edges of timing signal SCK (to read both code segments).

Figure 6:
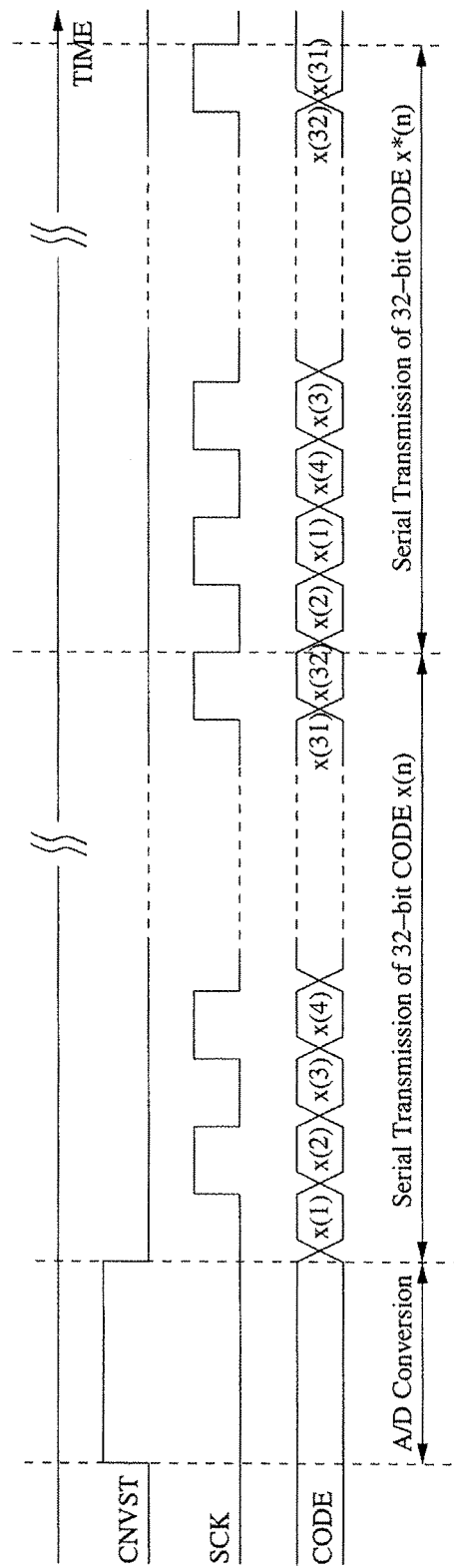
FIG. 6 illustrates a timing diagram for a fourth embodiment of the present teaching.

FIG. 6 shows a timing diagram for a fourth embodiment of the present teaching. It is similar to the third embodiment except for a variation of the digital interface-circuit 203. The fourth embodiment transmits a 64-bit digital code CODE on a serial interface. The first 32 bits of CODE are identical to the 32 bits of CODE of the third embodiment. Bits 33, 35, 37, . . . 63 of CODE are the same as bits 2, 4, 6, . . . , 32 of CODE. Likewise, bits 34, 36, 38, . . . , 64 of CODE are the same as bits 1, 3, 5, . . . , 31 of CODE. Accordingly, in the fourth embodiment, digital system 204 may read the serial interface at 32 consecutive rising edges of timing signal SCK to obtain the first and second parameters, starting with the first parameter. Likewise, digital system 204 may read the serial interface at 32 consecutive falling edges of timing signal SCK to obtain the first and second parameters, starting with the second parameter. Alternatively, digital system 204 may read the serial interface at both rising and falling edges for 16 consecutive pulses of timing signal SCK to obtain first and second parameters. Also, digital system 204 may be configured to read the serial interface at 16 consecutive rising or falling edges to obtain only the first or the second parameter. Accordingly, the fourth embodiment of the present teaching provides a plurality of parameters representative of a two-input analog signal V1, V2 in a predefined format CODE. Digital system 204 may select to obtain one or several parameters (in a selectable sequence) by evaluating a serial interface at rising and/or falling edges of a timing signal SCK.

FIG. 2 illustrates an embodiment of the present teaching wherein ADC system 200 comprises a first ADC 201 configured to provide a first digital representation D1 and a second ADC 202 configured to provide a second digital representation D2 to digital interface circuit 203. ADC 201 is a single-ended ADC circuit of a known type, such as for example a successive-approximation ADC or a delta-sigma ADC, nominally designating a numerical value D1=V1/VREF. Likewise, ADC 202 is a single-ended ADC circuit of a known type nominally designating a numerical value D2=V2/VREF. Digital interface circuit 203 combines D1 and D2 to derive a plurality of weighted representations DW=w1*D1+w2*D2 that are communicated to a digital system 204 as exemplified herein by several embodiments of the present teaching.

ADCs 201, 202 provide digital representations D1 and D2 with a peak signal-to-noise ratio (SNR) characterizing a noise level for a maximum signal level. For applications wherein analog quantities V1 and V2 are expected to have a mutual correlation of close to one, i.e. V1~V2, a weighted representation DW=w1*D1+w2*D2 for which w1=w2 (i.e., representative of an average of V1 and V2) may have a peak SNR superior to a peak SNR of D1 or D2 individually.

Figure 7:
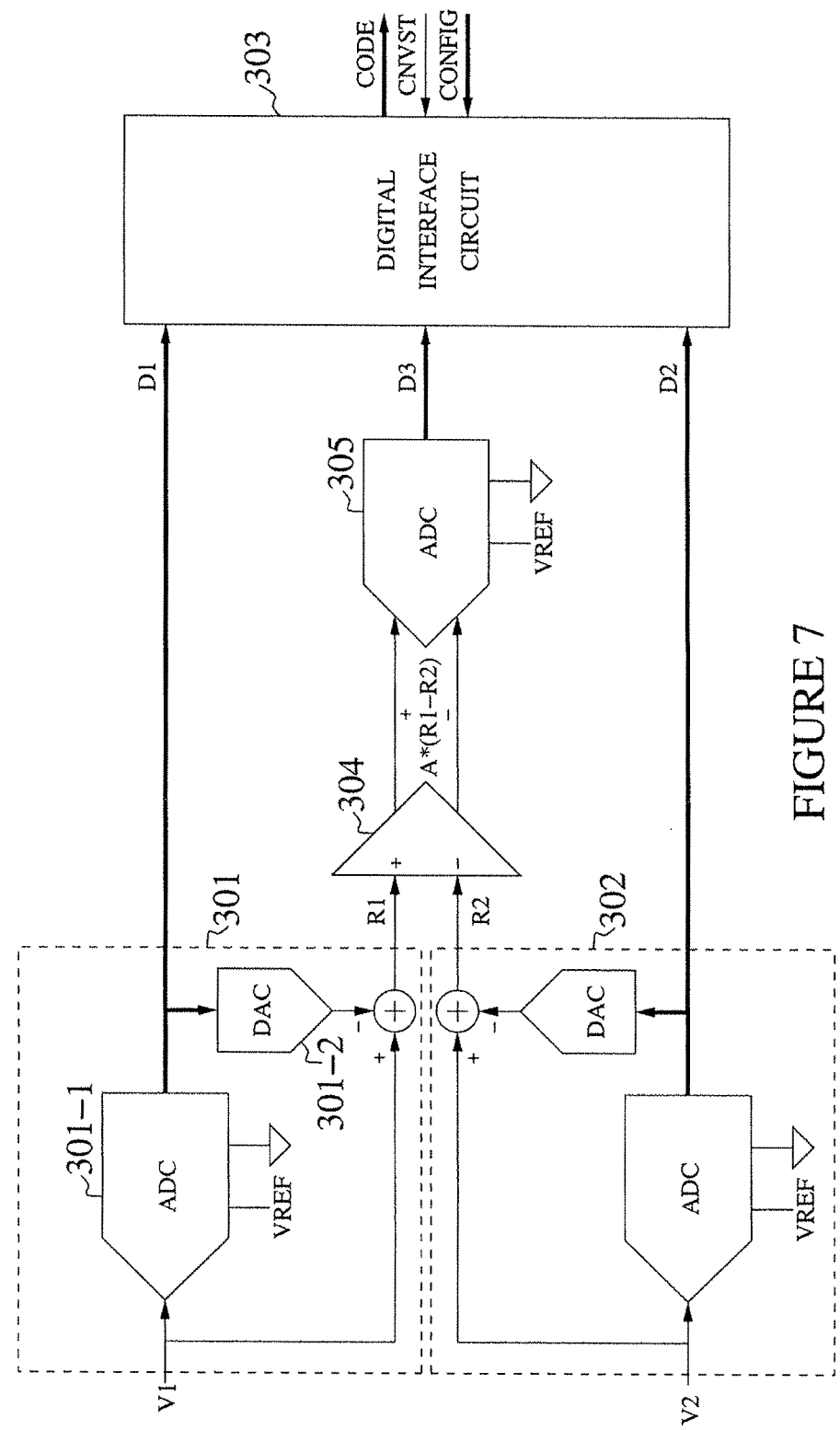
FIG. 7 illustrates a fifth embodiment of the present teaching.

FIG. 7 illustrates a fifth embodiment of the present teaching that may provide a high peak signal-to-noise ratio (SNR) for a first weighted representation D=(V1−V2)/VREF, as may be required for digital control system 100 of FIG. 1, while also providing another weighted representation (as may be needed to detect a fault condition). A first single-ended ADC circuit 301-1 is configured to receive a first analog quantity V1 and to provide a first code nominally designating a numerical value D1=V1/VREF. A first digital-to-analog converter (DAC) circuit 301-2 is configured to receive the first code and to provide an analog quantity that is subtracted from the first analog quantity V1 to derive a first analog residue quantity R1. ADC circuit 301-1 and DAC circuit 301-2 collectively is an ADC circuit 301 configured to receive V1 and to provide D1 and a residue R1 representative of V1 with respect to D1. A second ADC circuit 302 is configured to receive a second analog quantity V2 and to provide a second digital code and a second analog residue quantity R2 representative of the second analog quantity V2 with respect to the second digital code. A numerical value designated by the second digital code is nominally D2=V2/VREF. An optional residue-amplification circuit 304 is configured to receive first and second analog residue quantities R1, R2 and to provide an amplified analog residue difference A*(R1−R2). An amplification factor A of residue-amplification circuit 304 may be greater than one to improve a noise performance of the fifth embodiment. A third ADC circuit 305 is configured to receive the amplified analog residue difference and to provide a third digital code representative of a difference of the first and second analog residue quantities. A numerical value designated by the third digital code is nominally D3=(R1−R2)/VREF. Accordingly, a nominal operation of ADC circuit 305 incorporates amplification factor A of optional residue-amplification circuit 304. A digital interface circuit 303 is configured to receive first, second, and third digital codes (D1, D2, and D3) and to provide a digital code CODE representative of a plurality of numerical parameters. A first numerical parameter may be calculated by combining numerical values (D1−D2+D3) to represent (V1−V2)/VREF. A second numerical parameter may be calculated by combining numerical values (D1+D2) to represent (V1+V2)/VREF. Alternatively, a first and a second numerical parameter may be calculated as (D1+0.5*D3) and (D2−0.5*D3). Various other combinations of the first, second and third digital codes D1, D2, D3 may be selected to represent weighted representations of V1 and V2.

Digital interface circuit 303 may be configured to be responsive to a configuration code CONFIG, and a digital code CODE may be transmitted in one of several predefined formats via a serial and/or a parallel interface. Accordingly digital interface circuit 303 may provide a plurality of parameters to a digital system in the same way as described herein with reference to the first, second, third, and fourth embodiments of this present teaching.

Figure 8:
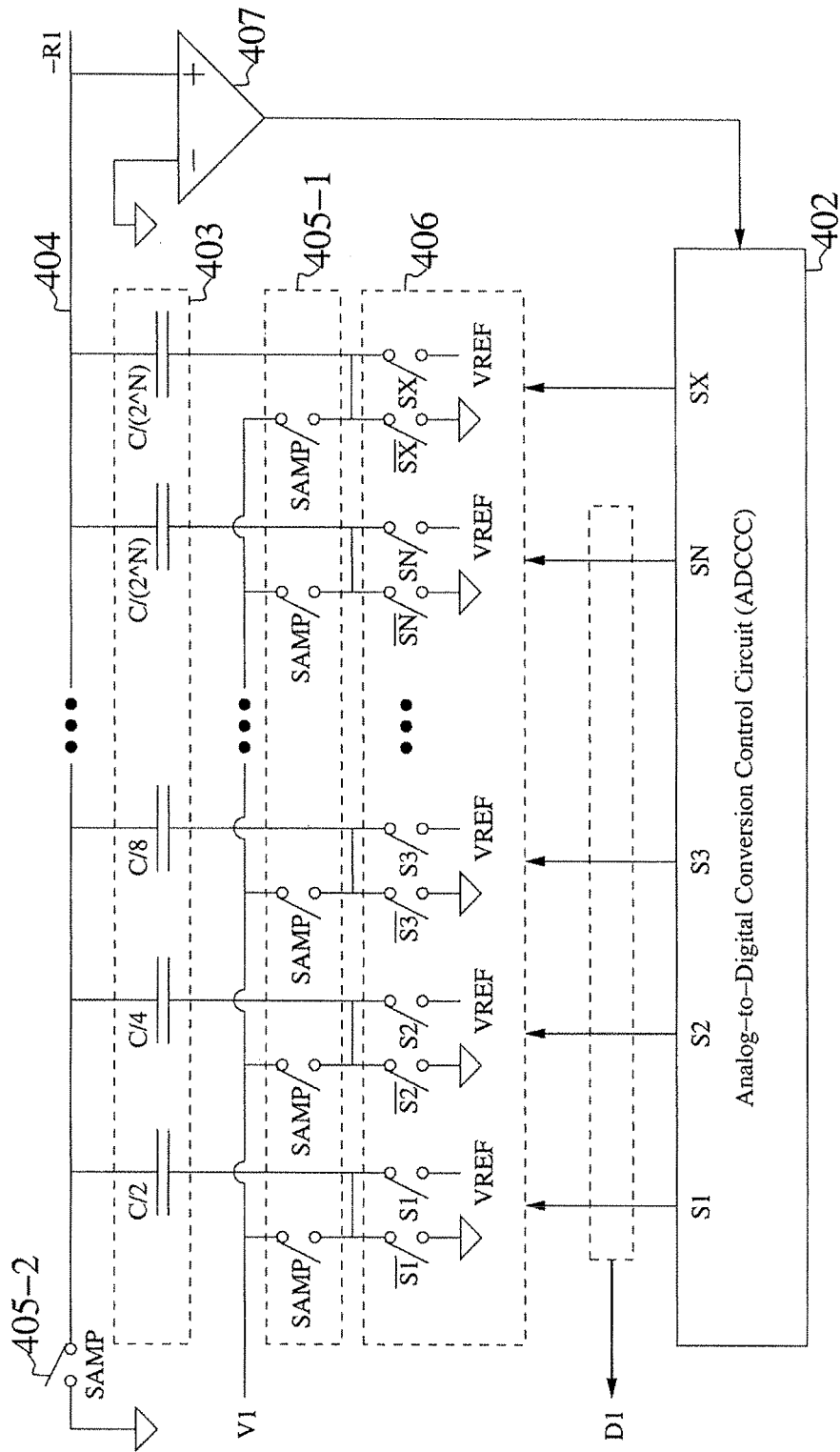
FIG. 8 illustrates an ADC circuit for single-ended A/D conversions.

FIG. 8 shows a preferred implementation of a single-ended ADC circuit 401 that may be used for ADC circuits 301, 302 of FIG. 7. ADC circuit 401 is a switched-capacitor circuit configured to provide an analog residue quantity (−R1) that has a polarity opposite of a polarity of analog residue quantity R1 provided by ADC 301. A change of polarity may be used in combination with a change of another polarity (e.g. a polarity of amplification factor A of residue-amplification circuit 304). Both analog residue quantities, (−R1) and R1, are representative of analog quantity V1 with respect to D1. ADC circuit 401 comprises an analog-to-digital conversion control circuit ADCCC 402 providing a plurality of N binary (high/low or I/O) control signals S1, S2, S3, . . . SN. Control signals S1, S2, S3, ... SN collectively is an N-bit binary-weighted code designating a numerical value D1. S1 is a most significant bit and SN is a least significant bit. ADC circuit 401 further comprises an array of scaled capacitors 403, comprising a number (N+1) of individual capacitors. Array of scaled capacitors 403 has a total capacitance C distributed according to a set of weighting factors for N-bit binary-weighted code D1. Accordingly, a capacitor corresponding to most significant bit S1 has a capacitance of C/2; a capacitor corresponding to a second-most significant bit S2 has a capacitance of C/4, and so forth. Two capacitors with capacitance $C/(2^N)$ correspond to least significant bit SN and a termination control signal SX. Termination control signal SX is always 0 (logic low) and is not part of the N-bit code for D1. Each capacitor in the array of capacitors 403 has a terminal connected to a common terminal 404, which is a port for analog residue quantity (−R1). During a sampling phase, preceding a conversion cycle, a plurality of sampling switches 405-1, 405-2 controlled by a sampling control signal SAMP couple voltage V1 to array of capacitors 403 to charge each capacitor in the array 403 to voltage V1. Sampling control signal SAMP is derived from a conversion-start signal CNVST (not shown explicitly in FIG. 8), and sampling switches 405-1, 405-2 are configured to be open (substantially non-conductive) during a conversion cycle. Accordingly, voltage V1 is sampled on capacitors 403 at a rising edge of CNVST initiating a conversion cycle. A plurality of DAC switches 406 are substantially non-conductive during the sampling phase, and conductive during a conversion cycle. Specifically, during conversion, DAC switches 406 couple a terminal of each capacitor in array of capacitors 403 to either ground or VREF according to a value of corresponding control signals S1, S2, S3, ... SN. A termination capacitor is coupled to ground by termination control signal SX=0. Accordingly, during a conversion cycle, a nominal voltage at terminal 404 is D1*VREF−V1, which is an analog quantity representative of a residue of V1 with respect to D1. A magnitude of analog residue quantity D1*VREF−V1=(−R1) is an indication of how accurately D1 represents V1. Various methods may be used to determine an N-bit accurate representation D1 of V1, including a well-known method of successive approximation. ADCCC 402 is a digital state machine configured to receive a logic state from a comparator circuit 407 indicative of a polarity of analog residue quantity (−R1). ADCCC 402 implements a successive-approximation algorithm (and may be referred to as a SAR) when configured to perform a sequence of steps wherein a value of D1 is increased from one step to a next step if comparator circuit 407 indicates a negative polarity of (−R1), and wherein the value of D1 is decreased if comparator circuit 407 indicates a positive polarity of (−R1). Specifically, ADCCC 402 is configured to implement a well-known binary-search successive-approximation algorithm to obtain an N-bit accurate representation D1 of V1 in N steps. In another embodiment, a flash ADC circuit may be used to increase a speed of ADC circuit 401. For example, an N-bit flash ADC circuit (evaluating V1, not shown) may be configured to provide an N-bit code for D1 in just one step. In another embodiment, a flash ADC of less than N-bit resolution may be configured with an ADCCC to implement a successive-approximation algorithm deriving an N-bit accurate code D1 in, for example, two steps.

Figure 9:
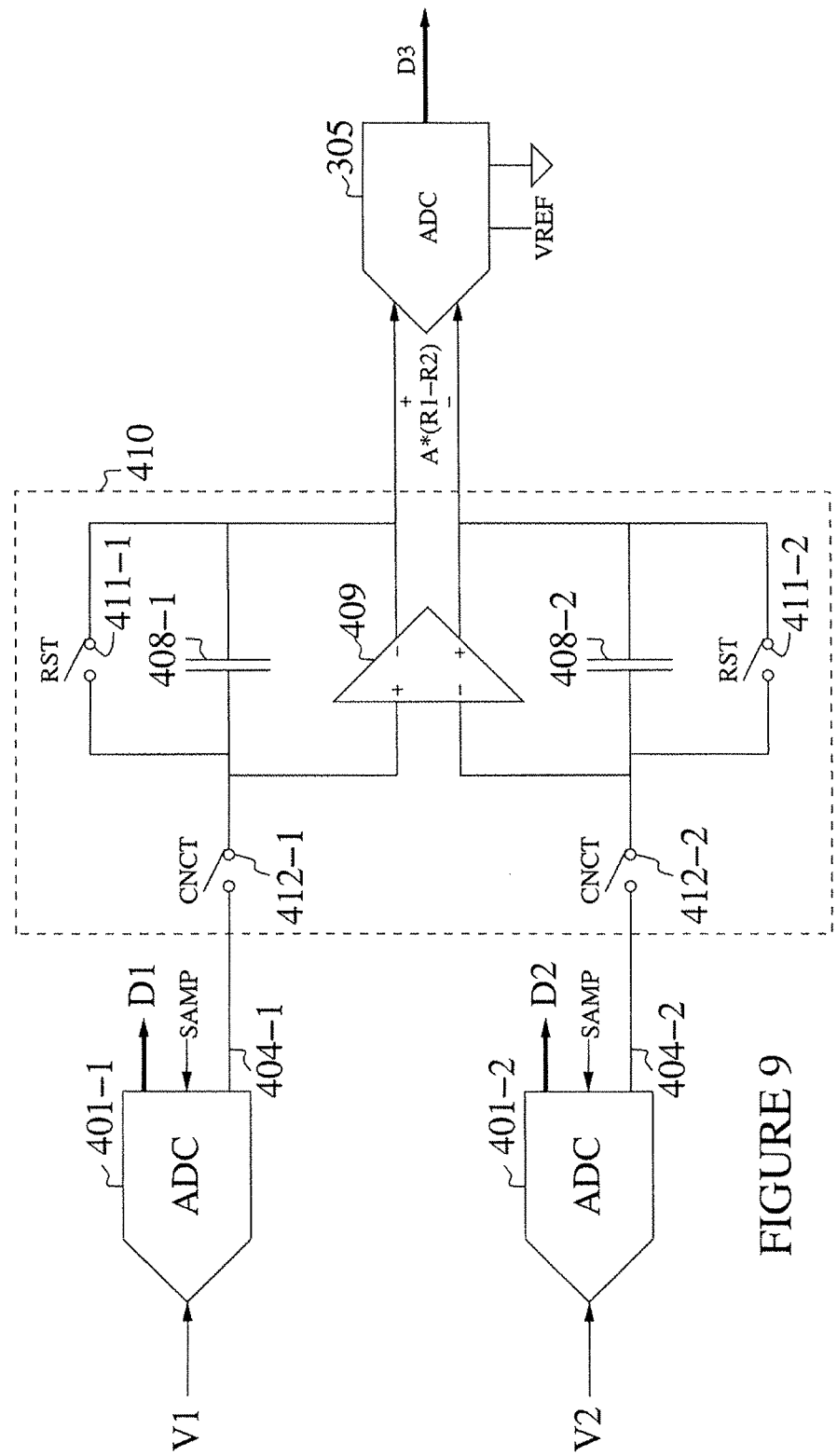
FIG. 9 illustrates a residue-amplification circuit configured according to an embodiment of the present teaching.
Figure 10:
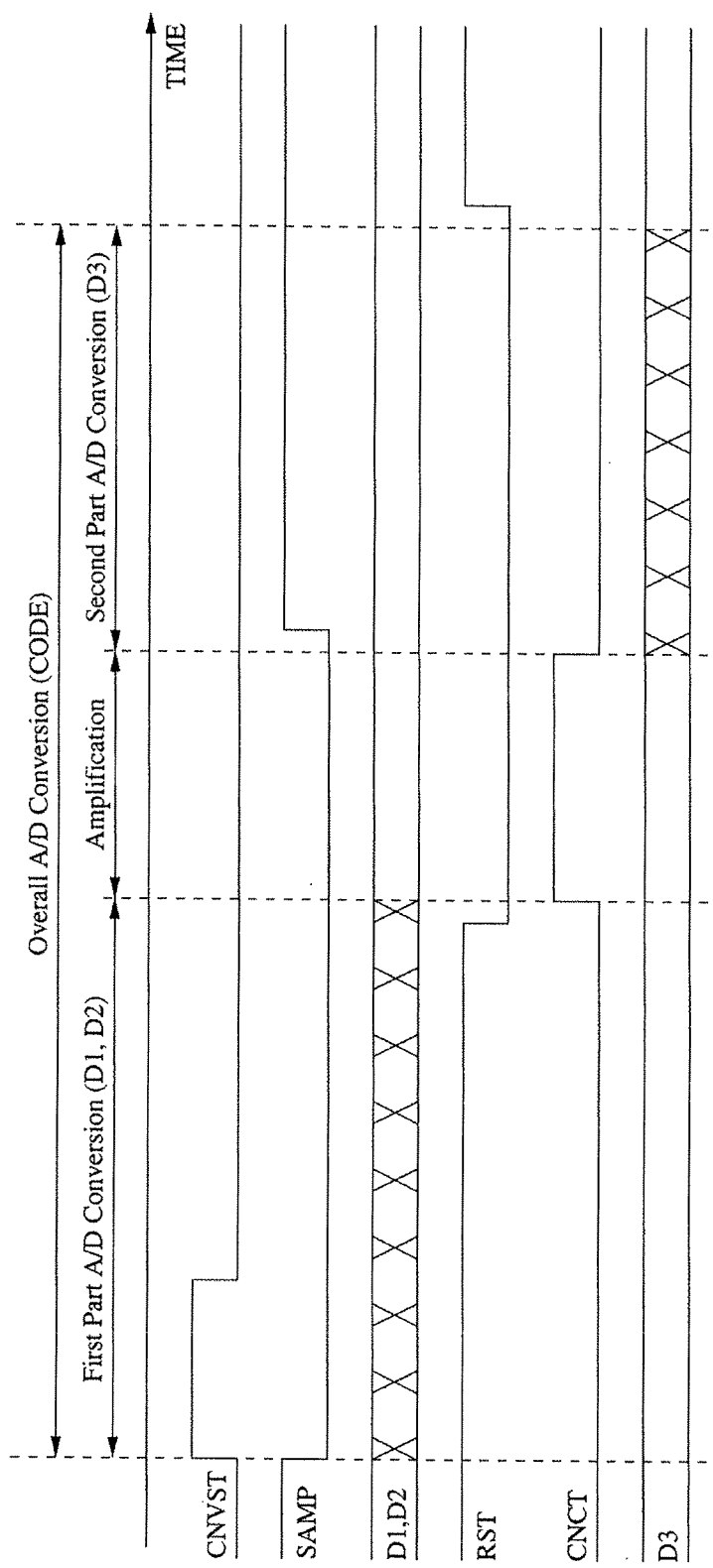
FIG. 10 illustrates a timing diagram for FIG. 9.

FIG. 9 shows a residue-amplification circuit 410 that may be used for residue-amplification circuit 304 of FIG. 7. FIG. 9 further shows how residue-amplification circuit 410 may be connected to a first and a second ADC circuit 401-1, 401-2 that may be used for ADC circuits 301, 302 of FIG. 7. ADC circuits 401-1, 401-2 are instances of ADC circuit 401 of FIG. 8. Specifically, first ADC circuit 401-1 receives a first analog quantity V1 and provides a first digital code for a numerical value D1 and a first analog residue quantity (−R1) via a first port 404-1 (port 404 in FIG. 8). Likewise, second ADC circuit 401-2 receives a second analog quantity V2 and provides a second digital code for a numerical value D2 and a second analog residue quantity (−R2) via a second port 404-2 (port 404 in FIG. 8). First and second ADC circuits 401-1, 401-2 are configured to receive a sampling control signal SAMP as described herein with reference to FIG. 8. Residue-amplification circuit 410 is a switched-capacitor circuit comprising switches 411-1, 411-2 controlled by a reset control signal RST and switches 412-1, 412-2 controlled by a connect control signal CNCT. FIG. 10 shows a timing diagram for control signals SAMP, RST, CNCT. A rising edge of a conversion-start signal CNVST initiates an overall conversion cycle, comprising a first-part A/D conversion cycle wherein digital codes for D1,D2 are determined, followed by a period for amplification of residues by residue-amplification circuit 410, followed by a second-part A/D conversion cycle wherein a digital code for D3 is determined. The first-part A/D conversion cycle will be described next. An operation of ADC circuits 401-1, 401-2 has been described herein with reference to FIG. 8. Switches 411-1, 411-2 are closed (conductive) and switches 412-1, 412-2 are open (substantially non-conductive). Accordingly, a first and a second capacitor 408-1, 408-2 are discharged and a differential output voltage from a differential operational amplifier circuit 409 is nominally zero. Accordingly, residue-amplification circuit 410 is configured in a reset configuration in preparation for a residue-amplification operation. Residue-amplification circuit 410 (and/or ADC circuit 305) may optionally perform an auto-zeroing operation during the first-part A/D conversion cycle. The process for amplification of residues will be described next. Switches 411-1, 411-2 are opened shortly before switches 412-1, 412-2 are closed. A voltage difference between ports 404-1, 404-2 (immediately before switches 412-1, 412-2 are closed) is representative of a difference of first and second analog residue quantities (R2−R1). When switches 412-1, 412-2 are closed, operational amplifier circuit 409 causes a redistribution of charge in capacitors 408-1, 408-2 via ports 404-1,404-2 such that a voltage between ports 404-1, 404-2 nominally settle towards zero. In a fully settled state, an amount of charge transferred in the redistribution of charge is an analog quantity representative of a difference of the first analog residue quantity (−R1) and the second analog residue quantity (−R2). Capacitors 408-1, 408-2 convert an analog quantity of charge into an analog quantity of voltage, and operational amplifier circuit 409 provides an output voltage difference that is representative of an amplified analog residue difference A*(R1−R2). Accordingly, residue-amplification circuit 410 is configured as a charge-to-voltage converter circuit. A residue-amplification factor A depends on a capacitance of capacitors 408-1, 408-2 and a capacitive output impedance of ADC circuits 401-1, 401-2. The capacitive output impedance depends on a total capacitance C of embedded arrays of capacitors (403, FIG. 8). For example, the residue amplification factor A may be 16, 64, or 256, and may be selected according to a resolution N of digital codes for D1 and D2. A frequency response of operational amplifier circuit 409 may be configurable and selected according to a feedback factor for each part of the overall A/D conversion process. The second-part A/D conversion cycle will be described next. ADC circuit 305 may be any type of ADC circuit configured to resolve amplified analog residue difference A*(R1−R2) provided by operational amplifier 409 with a desired accuracy. For example, digital codes for D1 and D2 may be 14-bit accurate, and ADC 305 may be a 6-bit flash ADC circuit configured to provide a 6-bit digital code for D3. Overlap techniques may be used to provide a measure of robustness for analog imperfections, and a digital code for a weighted representation (D1−D2+D3) may be of 18-bit resolution (combining two 14-bit codes and one 6-bit code). A choice of resolutions for ADC circuits 401-1, 401-2, and 305 may depend on which weighted representations for analog input quantities V1 and V2 that an application may require. For example, digital control system 100 of FIG. 1 may require a highly accurate representation of (V1−V2)/VREF and may require only a relatively coarse representation of (V1+V2)/VREF. For example, ADC circuits 401-1, 401-2 may be configured to provide 10-bit digital codes for D1 and D2, and ADC circuit 305 may be configured to provide a 10-bit code for D3. The three 10-bit codes for D1, D2, and D3 respectively, may be combined to provide a first weighted representation (D1−D2+D3) and a second weighted representation (D1+D2)/2. In another embodiment, a first weighted representation may be (D3/2+D1) and a second weighted representation may be (D3/2−D2). ADC circuit 305 may perform a sampling operation, for example controlled by control signal CNCT, such that ADC circuits 401-1, 401-2 may revert to a sampling configuration during the second-part A/D conversion cycle (to increase a maximum throughput rate). ADC circuit 305 may, for example, be a fully-differential SAR ADC (fully-differential configuration of single-ended ADC circuit 401 in FIG. 8; familiar to someone ordinarily skilled in the art).

Figure 11:
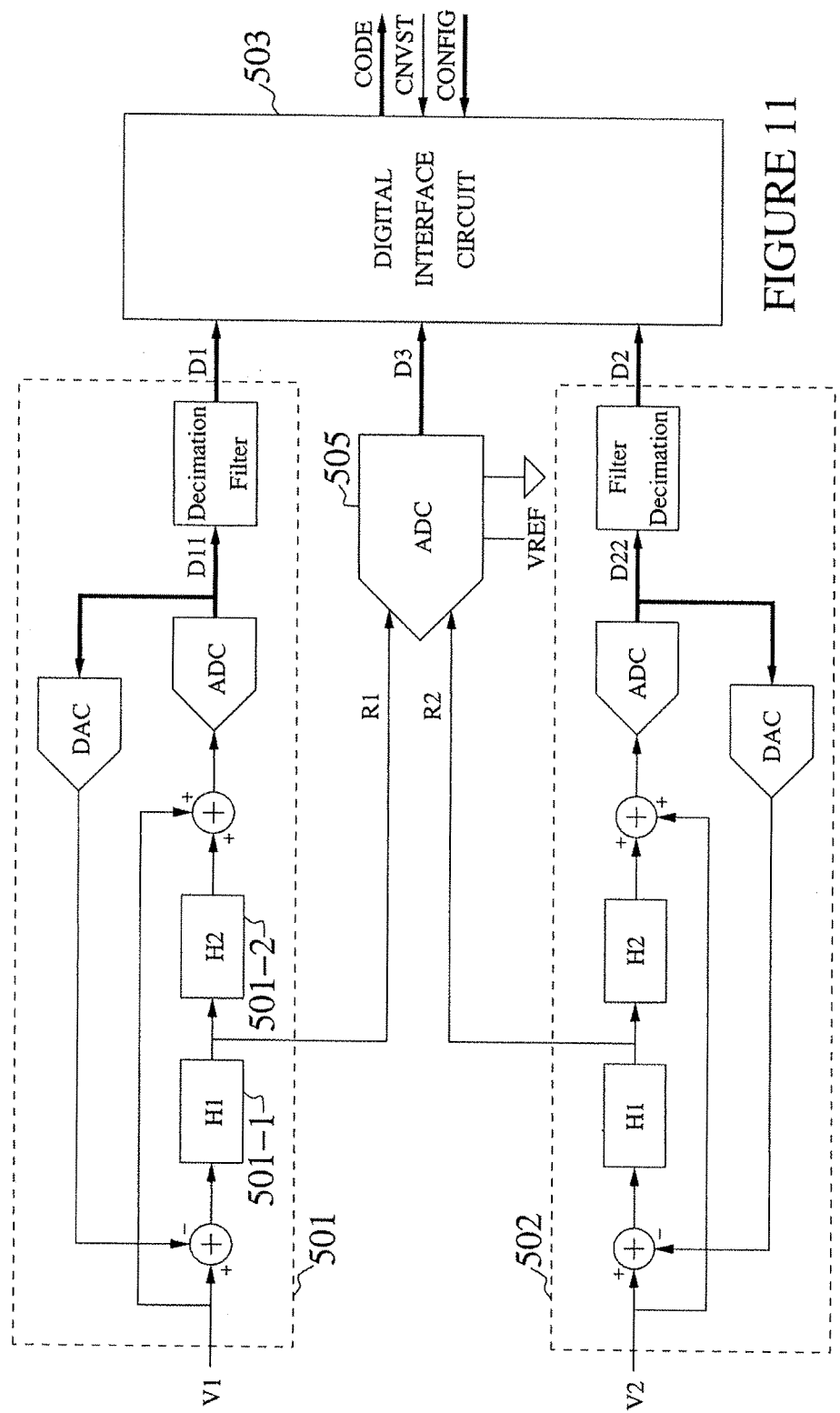
FIG. 11 illustrate an embodiment of the present teaching.

FIG. 11 shows another embodiment of the present teaching. A first delta-sigma ADC circuit 501 and a second delta-sigma ADC circuit 502 substitute ADC circuits 301, 302 of FIG. 7. A third ADC circuit 505 of FIG. 11 substitutes ADC circuit 305 of FIG. 7. Digital interface circuit 503 may be similar or identical to digital interface circuit 303 of FIG. 7. First and second delta-sigma ADC circuits 501, 502 provide analog residue quantities R1, R2 that do not require amplification, and optional residue-amplification circuit 304 of FIG. 7 is not included in the embodiment of FIG. 11. An operation of delta-sigma ADC circuits is well known. Delta-sigma ADC circuit 502 is substantially identical to delta-sigma ADC circuit 501. A first digital code for D1 is obtained by operating delta-sigma ADC circuit 501 for a predefined number NCLK of cycles of a clock signal CLK, and using a decimation filter to combine a set of NCLK values D11 (one value of D11 for each cycle of clock signal CLK). In one embodiment, clock signal CLK may be a free-running clock source, and NCLK may be referred to as a decimation factor. In another embodiment, clock signal CLK may be a burst of NCLK pulses, and ADC circuit 501 including the decimation filter may be reset prior to a conversion cycle (i.e., operating as an incremental-type delta-sigma ADC). Delta-sigma ADC circuit 501 comprises a first gain stage 501-1, which may be a discrete-time (e.g., switched-capacitor) or continuous-time (e.g., opamp-RC) integrator circuit providing substantial gain at baseband frequencies. A second gain stage 501-2 may be a discrete-time or continuous-time integrator circuit configured to have a zero in a frequency response at a predefined first frequency to nominally provide a minimum gain at frequencies higher than the predefined first frequency. An analog residue quantity R1 may be provided by an output of the first gain stage 501-1. R1 may be characterized by a substantial full-scale signal swing, and further amplification may not be required. In one embodiment, ADC circuit 505 may be a differential-input delta-sigma ADC circuit generating NCLK codes during a conversion cycle that are combined to provide a digital code for D3. In another embodiment, ADC circuit 505 may be a SAR ADC or a flash ADC providing a single code representative of an analog residue difference at an end of a conversion cycle for delta-sigma ADC circuits 501, 502. ADC circuit 505 may be configured to implement an operation that normalizes a value of D3 with respect to a frequency response of first gain stage 501-1 and/or delta-sigma ADC circuit 501.

Numerous variations of the present teaching are envisioned, and the embodiments described herein are merely illustrations of exemplary embodiments. The appropriate choice of circuitry, architectures, algorithms, signals and numerical representations may depend on the specific application and other factors such as the available types of semiconductors, capacitors, resistors, reliability voltage limits, silicon area, cost, and additional factors and considerations typically involved in the design of an integrated circuit. For example, digital interface circuits and ADC control circuits may be implemented as digital state machines in a CMOS technology, or using any other known circuit technique, method and process technology suitable for the implementation of such circuits.

Circuits implemented according to this present teaching may incorporate a plurality of types of semiconductor devices (including all flavors of MOS, BJT, IGBT, IGFET, JFET, FINFET, organic transistors, nano-carbon-tube devices etc.), some of which may be selected to withstand high voltages, and others which may be selected for fast settling of low-voltage circuit nodes. Circuits may be implemented using a technology that provides asymmetrical devices (BCD etc.) in addition to symmetrical MOS devices, and the technology may incorporate oxides and other physical structures having a plurality of dimensions and electrical properties.

An analog circuit may be based on and process any type of analog quantity, including but not limited to, voltage (any type of potential energy), current (flow of any substance), charge (amount of any substance), magnetism (field of any type E/H/B, . . . ), wave length (color, tone, . . . ), velocity (any type of kinetic energy), frequency/delay/phase (any time-related parameter), temperature, intensity, density, viscosity, activity, and/or combinations thereof.

An analog/digital quantity may or may not be characterized as a signal. A signal may be characterized with respect to a continuous, discrete, or mixed time variable/reference. A discrete time variable may be uniform or non-uniform.

A digital state of a code may be represented by an analog quantity, and may be binary (a "bit") or multi-level. A plurality of analog quantities may be used for multi-dimensional codes (e.g. 2 node voltages representing 2 bits). A resolution of a code (including multi-dimensional codes comprising multi-level digital states) may be characterized by a number of bits calculated as a logarithm-base-2 of a number of permutations that the code may assume. A digital representation, such as CODE, may be transferred via a parallel or a serial interface with one or more data lanes. A parallel/serial interface may communicate information along any media suitable for transport of a physical phenomenon selected to represent digital states, including without limitation voltage and current signals transported via a conductive media. A serial interface may provide galvanic isolation to limit interference, enhance safety, or to derive some other benefit. A serial interface may incorporate an explicit timing signal (e.g., a clock signal), or it may be self-timing with or without a dc-balancing function. Spectrum-spreading techniques may be used to reduce interference. A serial interface may be shared with other applications (including applications not performing A/D conversion), and several bit streams may be multiplexed in a single data stream. A serial interface may be bidirectional, and may be used to configure an ADC circuit and/or interface circuitry (including CONFIG codes). Any known method to suppress or prevent bit errors may be incorporated, including without limitation encoding using error correcting codes.

An ADC system implemented according to the present teaching may provide numerical parameters of any resolution (e.g., 4, 8, 11, 16, 18, 20, or 24 bits). A first and a second numerical parameter need not be of the same resolution. A quantization process may be uniform or non-uniform. Embodiments of the present teaching comprise ADC circuits converting single-ended and fully-differential signals. A pseudo-differential ADC (sampling a reference input substantially at the same time as an active input) may be used to convert a single-ended signal. A differential signal may be converted by an ADC system comprising a differential-to-single-ended front-end and a single-ended ADC back-end. Single-ended and/or differential signals may be A/D converted by ADC circuits configured to operate according to any known A/D conversion principle, including without limitation, successive-approximation, delta-sigma, sigma-delta, incremental, dual-slope, multi-slope, flash, folding, two-step, sub-ranging, pipeline, cyclic, counting, controlled-oscillator VCO/ICO, delay-based, sampling, time-averaging, and combinations thereof. A filtering process, including a multi-rate filtering process, may be used to combine results from several A/D conversions. An A/D conversion process/circuit used in combination with this present teaching may incorporate several algorithms and/or circuit techniques, including without limitation digital overlap, digital calibration/correction (static or adaptive, operating in the background, foreground, in-loop or out-of-loop), compensation, bootstrapping, gain-boosting oversampling, mismatch-shaping, averaging, filtering, application of dither (additive and/or transparent), and/or any other known method to overcome imperfections of a data converter circuit and/or to improve its performance.

This present teaching may be incorporated as a subsystem in a larger ADC system and/or an integrated-circuit system of a higher degree of functional complexity, such as industrial control systems, medical applications (e.g., x-ray and MRI machines), consumer applications (e.g., games and television), etc.

Accordingly, while particular embodiments of the present teaching have been shown and described, it will be obvious to those skilled in the art that changes and modifications may be made without departing from this present teaching in its broader aspects and, therefore, the appended claims are to encompass within their scope all such changes and modifications that are within the true spirit and scope of this present teaching.

What is claimed is:

1. An analog-to-digital converter system, comprising:
  a first analog-to-digital converter circuit configured to provide a first code representative of a first analog quantity; the first analog-to-digital converter circuit further configured to provide a first analog residue quantity representative of the first analog quantity with respect to the first code;
  a second analog-to-digital converter circuit configured to provide a second code representative of a second analog quantity; the second analog-to-digital converter circuit further configured to provide a second analog residue quantity representative of the second analog quantity with resect to the second code;
  a third analog-to-digital converter circuit configured to provide a third code representative of a difference of the first analog residue quantity and the second analog residue quantity;
  a digital interface circuit configured to provide an output code representative of at least one of the first, second, and third codes,
  wherein the first analog quantity is a first voltage applied between a first terminal and a reference terminal, and the second analog quantity is a second voltage applied between a second terminal and the reference terminal.

2. The analog-to-digital converter system of claim 1 wherein the third analog-to-digital converter circuit comprises a charge-to-voltage converter circuit configured to receive an amount of charge representative of a difference of the first analog residue quantity and the second analog residue quantity.

3. An analog-to-digital converter system, comprising:
  a first analog-to-digital converter circuit configured to provide a first code representative of a first analog quantity; the first analog-to-digital converter circuit further configured to provide a first analog residue quantity representative of the first analog quantity with respect to the first code;
  a second analog-to-digital converter circuit configured to provide a second code representative of a second analog quantity; the second analog-to-digital converter circuit further configured to provide a second analog residue quantity representative of the second analog quantity with respect to the second code;
  a third analog-to-digital converter circuit configured to provide a third code representative of a difference of the first analog residue quantity and the second analog residue quantity;
  a digital interface circuit configured to provide an output code representative of at least one of the first, second, and third codes,
  wherein the digital interface circuit is configurable and configured in a first configuration to encode a first set of information in the output code and configured in a second configuration to encode a second set of information in the output code.

4. An analog-to-digital converter system, comprising:
  a first analog-to-digital converter circuit configured to provide a first code representative of a first analog quantity; the first analog-to-digital converter circuit further configured to provide a first analog residue quantity representative of the first analog quantity with respect to the first code;
  a second analog-to-digital converter circuit configured to provide a second code representative of a second analog quantity; the second analog-to-digital converter circuit further configured to provide a second analog residue quantity representative of the second analog quantity with respect to the second code;
  a third analog-to-digital converter circuit configured to provide a third code representative of a difference of the first analog residue quantity and the second analog residue quantity;
  a digital interface circuit configured to provide an output code representative of at least one of the first, second, and third codes,
  wherein the output code comprises a first code segment representative of a first weighted representation of the first analog quantity and the second analog quantity, and the output code further comprises a second code segment representative of a second weighted representation of the first analog quantity and the second analog quantity; the first weighted representation being different from the second weighted representation.

5. The analog-to-digital converter system of claim 4 wherein the digital interface circuit comprises:

a serial interface circuit configured to transmit the first code segment at a first plurality of time instances when a timing signal transitions from a first state to a second state; the serial interface circuit further configured to transmit the second code segment at a second plurality of time instances when the timing signal transitions from the second state to the first state.

6. The analog-to-digital converter system of claim 4 wherein the digital interface circuit comprises:

a serial interface circuit configured to transmit sequentially the first code segment and the second code segment.

7. The analog-to-digital converter system of claim 4 wherein the first code segment is representative of the first analog quantity, and the second code segment is representative of the second analog quantity.

8. The analog-to-digital converter system of claim 4 wherein the first code segment is representative of a difference of the first analog quantity and the second analog quantity, and wherein the second code segment is representative of the first analog quantity.

9. The analog-to-digital converter system of claim 4 wherein the first code segment is representative of a difference of the first analog quantity and the second analog quantity, and wherein the second code segment is representative of an average of the first analog quantity and the second analog quantity.

10. The analog-to-digital converter system of claim 1 wherein the first analog-to-digital converter circuit comprises an array of scaled capacitors.

11. The analog-to-digital converter system of claim 1 wherein the first analog-to-digital converter circuit is configured to operate according to a successive-approximation algorithm.

12. A circuit-implemented method for providing a plurality of numerical parameters representative of a first analog quantity and a second analog quantity, comprising the steps of:

generating a first code representative of the first analog quantity;

generating a second code representative of the second analog quantity;

combining the first analog quantity, the second analog quantity, the first code, and the second code to derive an analog residue quantity;

generating a third code representative of the analog residue quantity;

combining the first, second, and third codes to provide the plurality of numerical parameters, further comprising the step of:

transmitting on a serial interface a first parameter representative of a difference of the first analog quantity and the second analog quantity.

13. The method of claim 12 wherein the plurality of parameters comprise a second parameter representative of the first analog quantity.

14. The method of claim 13 wherein the plurality of parameters further comprise a third parameter representative of the second analog quantity.

15. The method of claim 12 further comprising the step of: providing a successive-approximation algorithm.

16. The method of claim 12 further comprising the step of: providing a switched-capacitor circuit.

17. The method of claim 12 wherein the step of generating the third code representative of the analog residue quantity comprises the step of:

amplifying the analog residue quantity.

18. The method of claim 17 further comprising the step of: auto-zeroing a circuit.

* * * * *